(12) United States Patent  
Kleyman et al.

(10) Patent No.: US 6,665,569 B1  
(45) Date of Patent: Dec. 16, 2003

(54) METHOD AND SYSTEM FOR DYNAMICALLY UPDATING GEOMETRIC MODELS

(75) Inventors: Vadim Kleyman, Andover, MA (US); Emmanuel Gerlovin, Wayland, MA (US)

(73) Assignee: Parametric Technology Corporation, Needham, MA (US)

( * ) Notice: Subject to any disclaimer, the term of this patent is extended or adjusted under 35 U.S.C. 154(b) by 0 days.

(21) Appl. No.: 09/482,405

(22) Filed: Jan. 12, 2000

(51) Int. Cl.⁷ .............................................. G06F 19/00
(52) U.S. Cl. ........................................................ 700/97
(58) Field of Search ............................. 700/95, 96, 97, 700/98, 118

(56) References Cited

U.S. PATENT DOCUMENTS

| | | | | |
|---|---|---|---|---|
| 4,845,651 A | * | 7/1989 | Aizawa et al. | 345/581 |
| 4,901,250 A | * | 2/1990 | Ishida | 345/848 |
| 5,251,290 A | | 10/1993 | Pabon | 345/420 |
| 5,497,452 A | * | 3/1996 | Shimizu et al. | 345/420 |
| 5,988,862 A | * | 11/1999 | Kacyra et al. | 703/6 |
| RE36,602 E | * | 3/2000 | Sebastian et al. | 700/97 |
| 6,333,749 B1 | * | 12/2001 | Reinhardt et al. | 345/629 |
| 6,535,211 B1 | * | 3/2003 | Hariya et al. | 345/423 |

FOREIGN PATENT DOCUMENTS

| | | |
|---|---|---|
| EP | 0 365 456 A2 | 4/1990 |
| EP | 0 397 904 A1 | 11/1990 |
| GB | 2 311 154 A | 9/1997 |

* cited by examiner

*Primary Examiner*—Leo Picard  
*Assistant Examiner*—Chad Rapp  
(74) *Attorney, Agent, or Firm*—Lahive & Cockfield, LLP (57) ABSTRACT

A computer implemented method for dynamically updating a geometric model uses a data structure in which selected constituent elements of the model are associated to form a logical element with dynamically linked pointers to the selected constituent elements. One or more procedures reference the logical element as an input parameter. This indirect referencing of the constituent elements enables the procedure to accommodate fundamental changes to the selected constituent elements without requiring a designer to change the input parameter list of the procedure.

15 Claims, 9 Drawing Sheets

```
begin
{
edge12a := make_edge(r1, r2);
edge12b := make_edge(r2, r3);
edge12c := make_edge(r3, r4);
edge12d := make_edge(r4, r5);
edge12e := make_edge(r5, r6);
edge12f := make_edge(r6, r2);
axis := def_line(ra, rb);
prism := extrude(edge12a, edge12b, edge12c,
                 edge12d, edge12e, edge12f, axis);
}
end
```

*FIG. 5*

```
begin
{
edge12a := make_edge(r1, r2);
edge12b := make_edge(r2, r3);
edge12c := make_edge(r3, r4);
edge12d := make_edge(r4, r1);
axis   := def_line(ra, rb);
prism  := extrude(edge12a, edge12b, edge12c, edge12d, axis);
}
end
```

```
begin
{
edge12a := make_edge(r1, r2);
edge12b := make_edge(r2, r3);
edge12c := make_edge(r3, r4);
edge12d := make_edge(r4, r5);
edge12e := make_edge(r5, r6);
edge12f := make_edge(r6, r2);
axis := def_line(ra, rb);
base := associate(edge12a, edge12b, edge12c,
                  edge12d, edge12e, edge12f)

prism := extrude(base, axis);
}
end
```

METHOD AND SYSTEM FOR DYNAMICALLY UPDATING GEOMETRIC MODELS

FIELD OF THE INVENTION

This application relates to computer-aided-design systems, and in particular, to methods and systems for providing dynamic links between a geometric model and the constituents of that geometric model.

BACKGROUND

A computer-aided design (CAD) system is a tool for creating geometric models on a computer system. These geometric models, which are typically representative of physical objects, are built by a designer using a series of commands that instruct the system to create geometric primitives, such as edges and vertices, and to operate on these geometric primitives using various procedures supplied with the CAD system. These operations result in the creation of geometric elements which can then be assembled, using additional procedures, into a geometric model.

A typical procedure supplied with a CAD system generates an output representative of a geometric structure on the basis of one or more input parameters in an input parameter list. For example, a procedure might accept a circle, an axis, and an angle as input parameters and create a solid by rotating the circle about the axis by the angle. Another procedure might accept a polygon and a length as input parameters and extrude that polygon to the extent specified by the length, thereby generating a prism having the polygon as its cross-section. Yet another procedure might accept, as input parameters, two intersecting faces and return a structure in which the intersection of the input faces is smoothed out into a curve. One or more of the input parameters passed to a procedure can itself be the output of another procedure. This ability to evaluate compositions of procedures enables the designer to build geometric models of complex physical objects by performing a sequence of operations on relatively simple constituent components.

Figure 1:
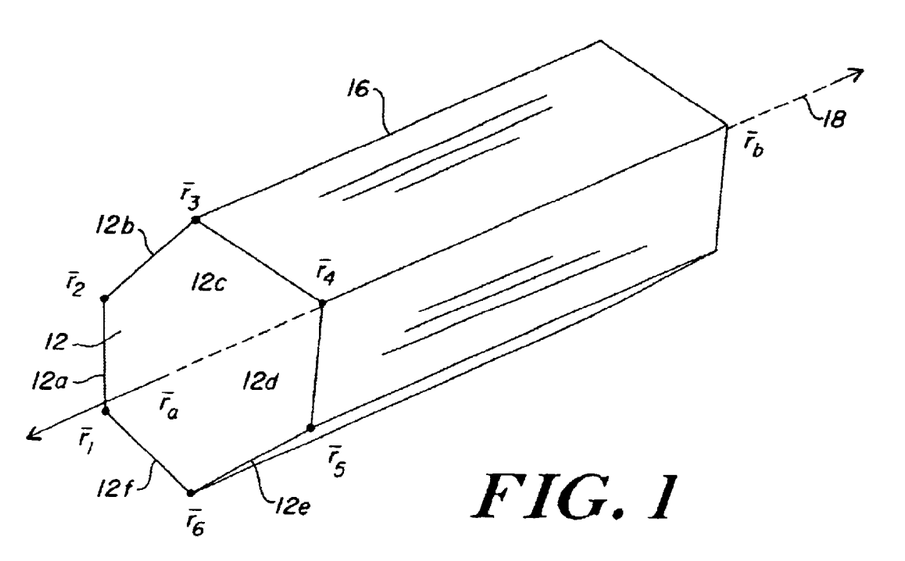
FIG. 1 is a geometric model of a hexagonal prism used to demonstrate the principles of the invention.
Figure 5:
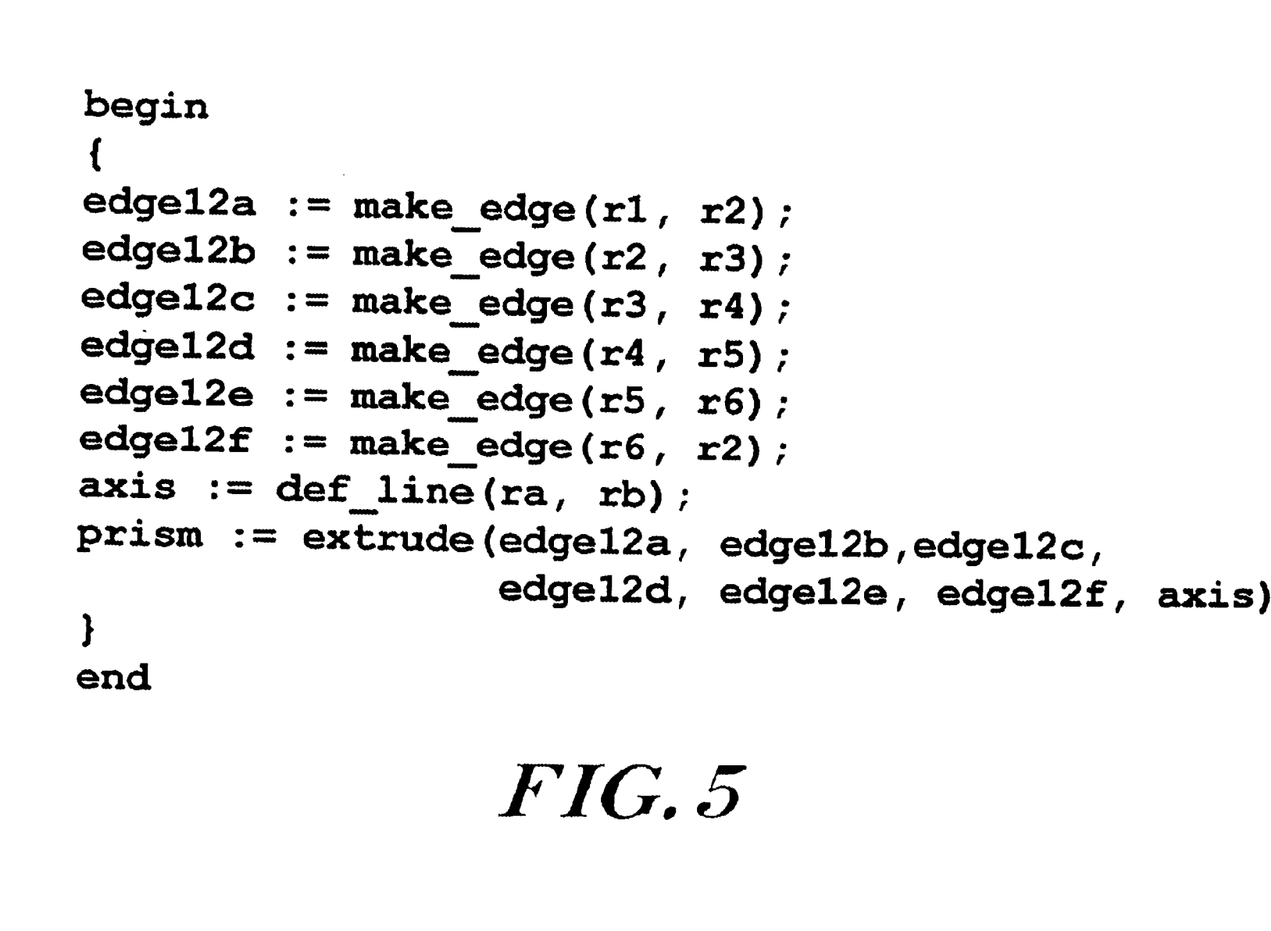
FIG. 5 illustrates an example of pseudo-code used to construct the geometric model of FIG.

To create a geometric model, a designer typically performs successive transformations on geometric primitives. For example, to generate the relatively simple prism shown in FIG. 1, a designer might define six edges 12*a–f*. The effect of this definition persists in time, thereby allowing the edges to be used as input parameters for subsequently called procedures. The designer would then apply an extrusion procedure to generate a prism 16 by extending the hexagon 12 formed by these six edges 12*a–f* along a principal axis 18. For more complex geometric models, a lengthy chain of procedures is often required, with the output of one procedure serving as an input to the next procedure in the chain. An example of pseudo-code one might use to describe the construction of the geometric model in FIG. 1 is shown in FIG. 5.

Figure 2:
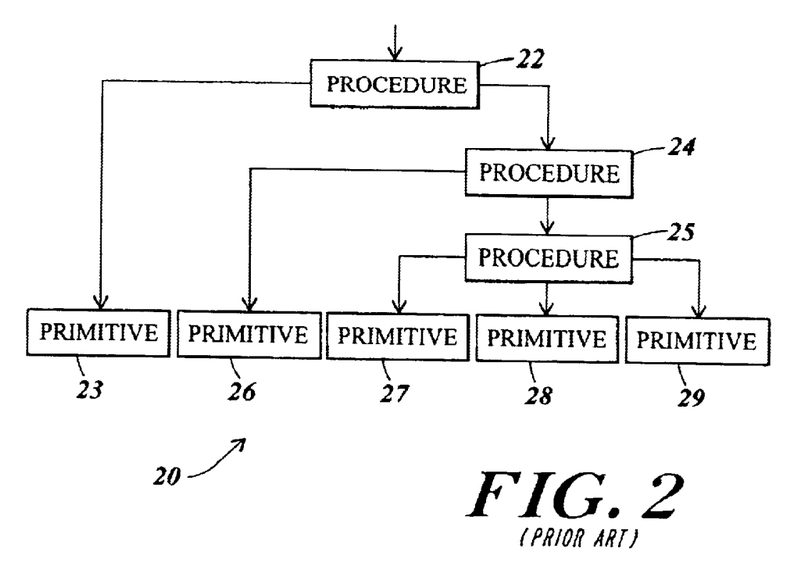
FIG. 2 is a prior art data structure representative of a geometric model.

FIG. 2 illustrates a prior art data structure 20 representative of a geometric model designated by a pointer to the output of a third procedure 22. This third procedure 22 has a pointer to both a first geometric primitive 23 and the output of a second procedure 24. As a result, the first geometric primitive 23 and the output of the second procedure 24 are input parameters in the input parameter list of the third procedure 22. The second procedure 24 has a first pointer to the output of a first procedure 25 and a second pointer to a second geometric primitive 26. As a result, the second geometric primitive 26 and the output of the first procedure 25 are input parameters in the input parameter list of the second procedure 24. The first procedure 25 has three pointers: a first pointer directed to a third geometric primitive 27, a second pointer directed to a fourth geometric primitive 28, and a third pointer directed to a fifth geometric primitive 29. Consequently, the input parameter list of the first procedure includes, as input parameters, the third, fourth, and fifth geometric primitives. Consequently, the input parameter list of the first procedure includes as input parameters, the third, fourth, and fifth geometric primitives.

Figure 3:
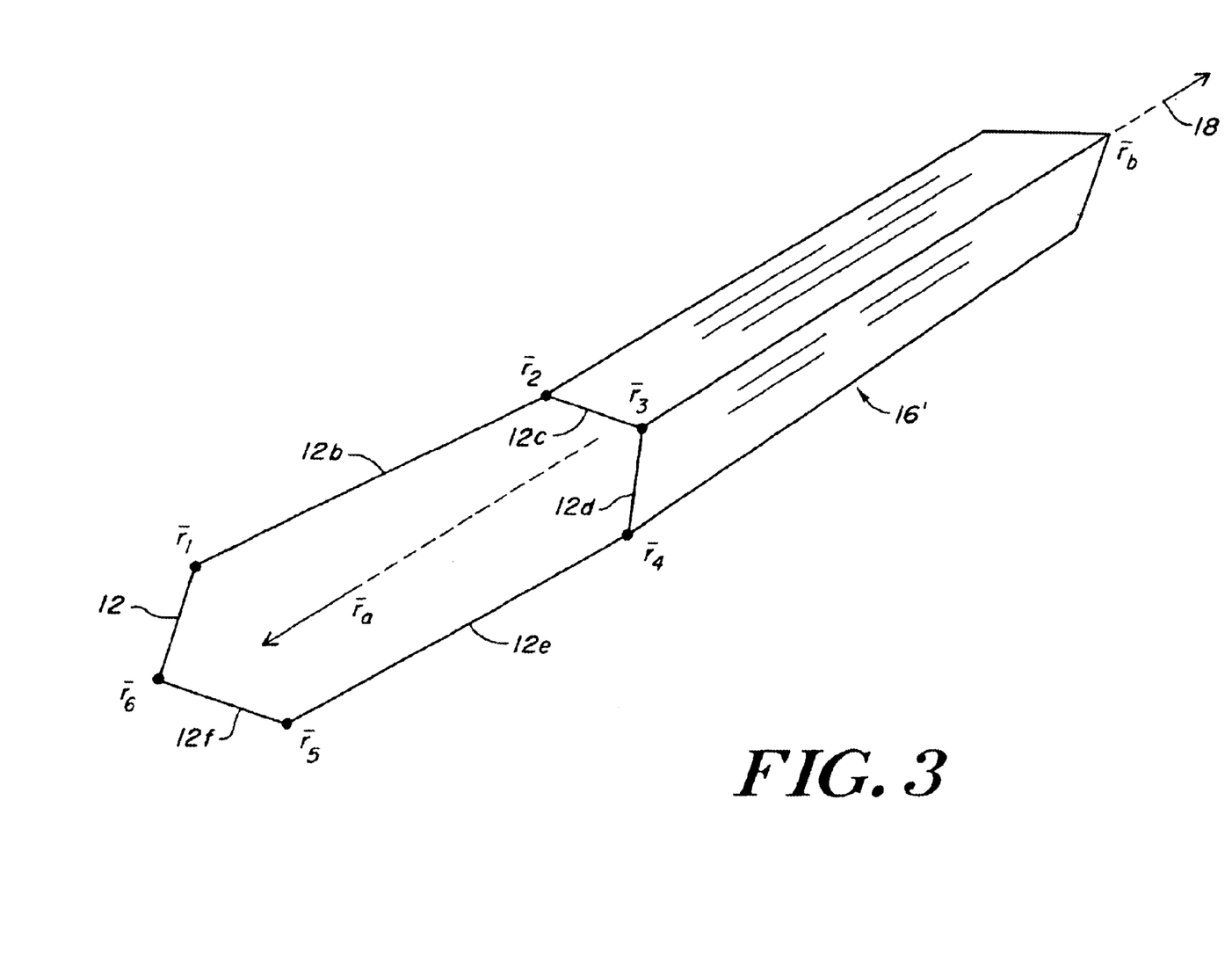
FIG. 3 is the prism of FIG. 1 following a change in the lengths of the hexagon's edges.

In most cases, a design undergoes several iterations before completion. Each iteration can require revisions having ramifications that propagate throughout the geometric model. For example, with reference to FIG. 1, if the designer were to lengthen two edges 12*b*, 12*e*, the appearance of the entire prism 16 would have to be altered, as shown in FIG. 3. Were this prism 16 to be an input parameter to a second procedure, the output of that second procedure would most likely have to be altered.

Examination of FIG. 2 suggests that a change in, for example, the second geometric primitive 26 will be manifested in a change in the output of the second procedure 24 because the second procedure 24 has a pointer directed at the second geometric primitive 26. The result of changing the second geometric primitive 26 will be manifested in a change in the output of the third procedure 27 because that procedure includes a pointer to the output of the second procedure 26. As a result, the change in the second geometric primitive 26 is manifested in a change in the geometric model, which has a pointer directed to the output of the third procedure 27.

It is thus known in the art to dynamically link the output of one procedure to the input of another procedure in such a way that the ramifications of a change in the dimensions of a geometric primitive propagate throughout the geometric model. This ability to dynamically update the geometric model is made possible by the fact that the constituent geometric primitives of a geometric model have unique tags, or identifiers, that are available to each procedure. Consequently, a procedure can accommodate changes in an input parameter by looking up the tag associated with that input parameter and obtaining the properties associated with the constituent element identified by that tag.

A more fundamental change to the geometric model poses significant problems in dynamically updating that model. For example, it is not possible to transform the prism in FIG. 1 into the prism shown in FIG. 4 by merely changing the dimensions or the orientation of existing edges. Instead, it is necessary to actually delete two edges 12*e*, 12*f*. Examination of the pseudo-code shown in FIG. 5 suggests a lurking difficulty in deleting an edge. Since two of the edges 12*e*, 12*f* in the input parameter list of the extrude function will no longer exist, the extrude function will encounter an error. This disadvantage arises from the fact that in conventional methods of geometric modeling, even if the values of the parameters in the input parameter list are dynamically bound to the procedure, the input parameter list itself is statically bound to that procedure. Hence, although a procedure can be responsive to a change in the value of one of the input parameters in its input parameter list, it cannot readily respond to a change in the input parameter list itself.

Figure 4:
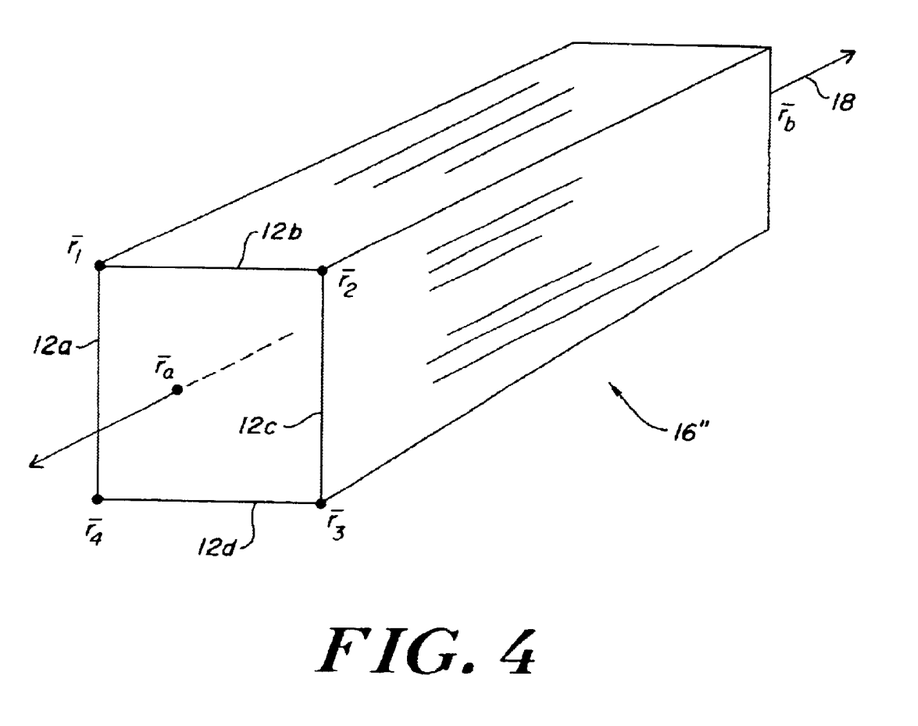
FIG. 4 is a rectangular prism formed by removing two edges from the hexagonal prism of FIG. 1.

In the context of the foregoing example, a change in the length of the edge 12*e*, as shown in FIG. 3, is merely a change in the value of an input parameter in an input parameter list. Such a change can readily be accommodated by known geometric modeling systems in which parameter values are dynamically bound to the procedure. However, the actual deletion of the edge 12e, as shown in FIG. 4, is a change in the input parameter list itself. Such a fundamental change cannot readily be accommodated by existing geometric modeling systems.

The difficulty associated with such a fundamental change in the geometric model is also apparent from FIG. 2. For example, the outright deletion of the second geometric primitive 26 results in the second procedure 24 having a stray pointer with nothing to point to. Consequently, in order to avoid an error in the second procedure 24, this stray pointer must also be deleted. Although this appears to be a relatively simple task in the simple example of FIG. 2, for a geometric model of even moderate complexity, there may be a large number of stray pointers, in which case the process of deleting stray pointers is a laborious one.

Conversely, if an additional geometric primitive is to be added to the geometric model, or if an additional procedure is to be used in constructing the model, additional pointers may have to be created and existing pointers may have to be moved. This task can become even more laborious than the task of deleting stray pointers.

Figure 6:
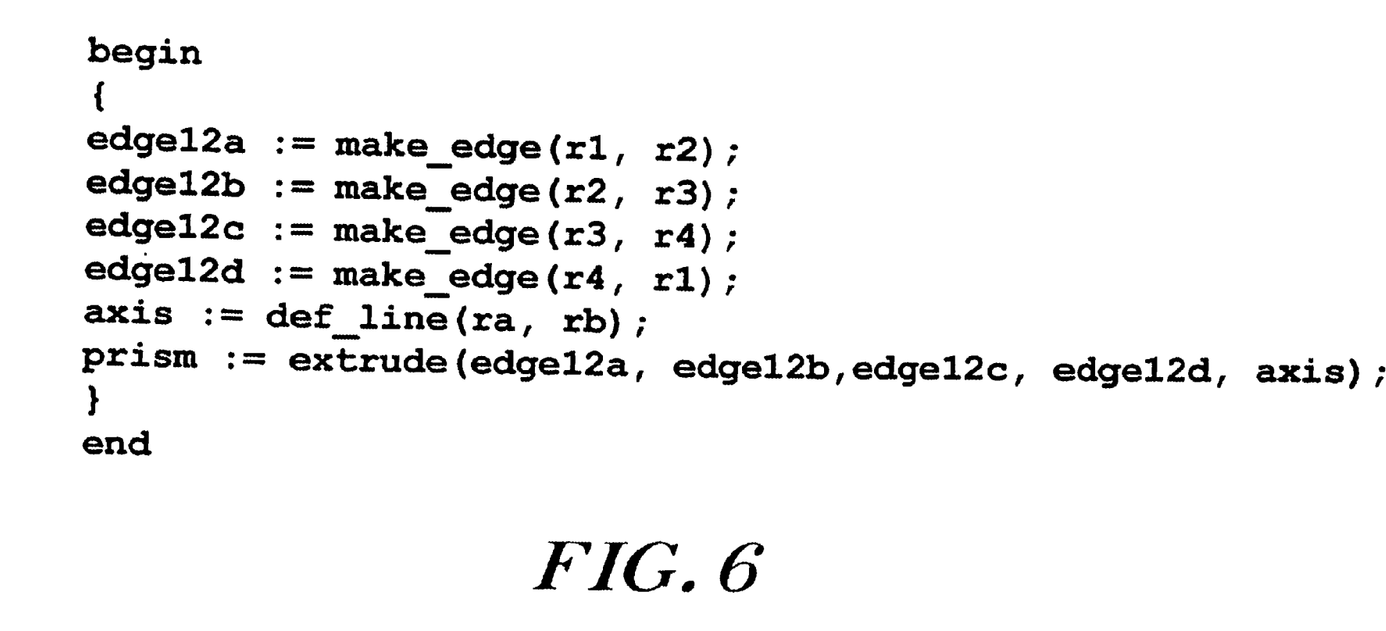
FIG. 6 shows an example of revisions to the pseudo-code of FIG. 5 used to change the geometric model of FIG. 1 to the geometric model of FIG. 4.

A change of this fundamental nature requires the designer to manually redesignate the constituent elements that are to form the input parameters for the various procedures used to generate the geometric model. In effect, the designer must alter the pseudo-code shown in FIG. 5 (generally by pointing and clicking on a visual rendition of the geometric model rather than by actually writing code) to change the input parameter list associated with the individual procedures. This would result in pseudo-code instructions equivalent to those shown in FIG. 6.

It is apparent from the foregoing that in the case of complex designs built by dozens of procedures, fundamental changes involving insertion and deletion of constituent geometric primitives can be laborious tasks. Hence, what is desireable in the art is a method and system for dynamically updating geometric models even when fundamental changes are made to the underlying constituents of that model.

SUMMARY

The shortcomings of the prior art are addressed by associating selected constituent elements of the geometric model and providing pointers to each of these selected constituent elements. These pointers form the basis for defining a logical element that is dynamically linked to the selected constituent elements and that can be referenced in an input parameter list of a procedure.

The method of the invention thus includes the steps of associating a plurality of selected constituent elements and a corresponding plurality of pointers to each of the selected constituent elements. The constituent elements and the pointers define a logical element. The method further includes the step of establishing a dynamic link between the logical element and the constituent elements through the pointers corresponding to those constituent elements. The logical element is then passed as an input parameter to a procedure having as its output a geometric model representative of a physical object.

A result of carrying out the method of the invention is that the resulting geometric model is automatically responsive to changes in the constituent elements. This desirable result is achieved because it is the logical element which is dynamically linked to the constituent elements, that is passed to the procedure and not the constituent elements themselves.

A data structure for practice of the invention includes a plurality of selected constituent elements selected from a plurality of constituent elements. These selected constituent elements are associated with a logical element by a corresponding plurality of pointers linking the selected constituent elements to the logical element. Each pointer includes a dynamic link such that a change in the selected constituent element is manifested in a change in a geometric model that includes the logical element.

By referencing a logical element instead of the selected constituent elements themselves, the procedure insulates itself from errors resulting from changes in those constituent elements. These changes can include not only changes in the values of the parameters associated with those constituent geometric elements but also changes in the number or type of those elements.

The selected constituent elements need not be selected from the set of geometric elements that make up the fundamental building blocks of the geometric model. These constituent elements can also include other logical elements or other data structures representative of geometric objects. Such data structures can be user-supplied data structures or outputs of other procedures.

The step of defining a logical element thus enables the procedure to indirectly reference selected constituent elements as input parameters. As a result, the designer who uses a CAD system incorporating the principles of the invention can easily make fundamental changes to the geometric model without the need to manually change the input parameter list of each procedure affected by those changes. This and other features and advantages of the invention will become more apparent from a reading of the following detailed description and the associated drawings in which:

DETAILED DESCRIPTION

In a system embodying the invention, a procedure need not reference the fundamental constituents of a geometric model directly. Instead, the procedure can reference associations of these fundamental constituents. These associations of fundamental constituents, referred to as "logical elements" can then be significantly altered without disrupting the input parameter list of the procedure.

Figure 7:
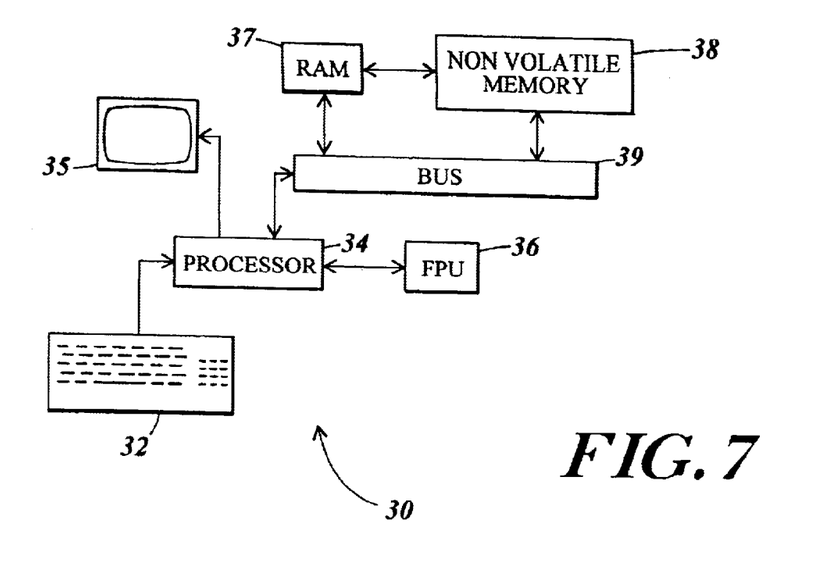
FIG. 7 is a computer system for implementing software that carries out the principles of the invention.

Referring to FIG. 7, a CAD system 30 embodying the invention includes: one or more input devices 32, typically a keyboard operating in conjunction with a mouse or similar pointing device, for communicating instructions from a user to a main processor 34; and a display monitor 35 for viewing text and graphics displayed by the system.

The main processor 34 is adapted to execute programmed instructions for implementing the method of the invention. Preferably, the main processor 34 is operably coupled to a floating-point coprocessor 36 to increase the performance of the CAD system 30 when performing arithmetic calculations. The CAD system 30 also includes a random access memory (RAM) 37 for storing programmed instructions to be executed by the main processor 34 and for temporary storage of data representative of a geometric object.

The system 30 further includes a non-volatile memory 38 for storage of data representative of a geometric object and a computer bus 39. The non-volatile memory 38 can be a hard disk local to the CAD system 30. Alternatively, the non-volatile memory 38 can be associated with a server or distributed across several servers, or be incorporated into an enterprise-wide data management system. The computer bus 39 permits communication between the main processor 34, RAM 37, and non-volatile memory 38 to provide for the transfer of data between the CAD system components.

The present invention includes a computer program such as a Computer Aided Design (CAD) or Computer Aided Engineering (CAE) tool or system, operable on the CAD system 30, for facilitating the design process. Such a program is typically stored on a computer readable medium such as a magnetic disk or other non-volatile memory 38 and paged into RAM 37 as necessary.

Figure 8:
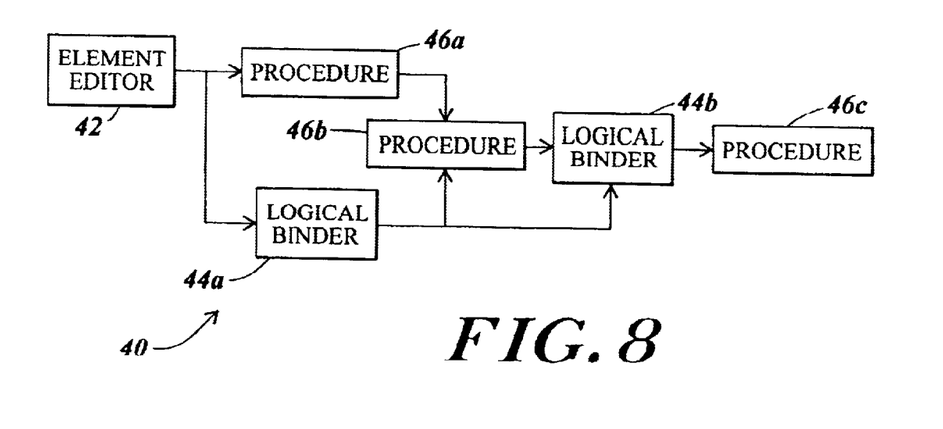
FIG. 8 shows representative architecture of a software system implementing the principles of the invention.

FIG. 8 shows the architecture of a representative system 40 embodying the principles of the invention. The system 40 includes an element editor 42 for creating the fundamental constituents of the geometric model. The element editor 42 is in communication with: one or more logical binders 44a, 44b, for associating related fundamental constituents into logical sets or groups of constituents; and procedures 46a–c, which operate on the fundamental constituents or on logical groups of such constituents. The input to a procedure can be any combination of: the output of the element editor 42, as illustrated by the first procedure 46a; the output of another procedure, as illustrated by the second procedure 46b; or the output of a logical binder, as shown by the second and third procedures 46b, 46c. Similarly, the input to a logical binder can be any combination of: the output of element editor 42, as shown by the first logical binder 44a; the output of a procedure, as shown by the second logical binder 44b; or the output of another logical binder, as shown by the second logical binder 44b. Additionally, each procedure and logical binder can have two or more inputs.

The particular configuration of logical binders and procedures will depend on the details of the geometric model and the steps used to construct that model. The particular configuration illustrated in FIG. 8 is selected to be an extremely simple one in order to teach the constituents of the system and the rules for interconnecting those constituents, and to do so without the burden of examining a figure of excessive complexity The element editor 42 receives, from a designer, instructions for the creation of certain geometric primitives. These geometric primitives represent the fundamental constituents of all geometric models created by the CAD system 40. Examples of such geometric primitives include vertices having selected coordinates and edges having selected endpoints. On the basis of these instructions, the element editor 42 creates computer-readable representations of the geometric primitives specified by the designer and binds them to identification tags. These bindings are static bindings that persist throughout the existence of the geometric primitives. The combination of a computer-readable representation of a geometric primitive and its associated identification tag shall hereafter be referred to as a "geometric element." These geometric elements persist and can therefore be thought of as being present in a modeling environment.

A geometric element generated by the element editor 42 can be passed directly to a procedure 46a as an input parameter. When this occurs, the procedure directly references the geometric element by its identification tag as shown in FIG. 9.

Figure 9:
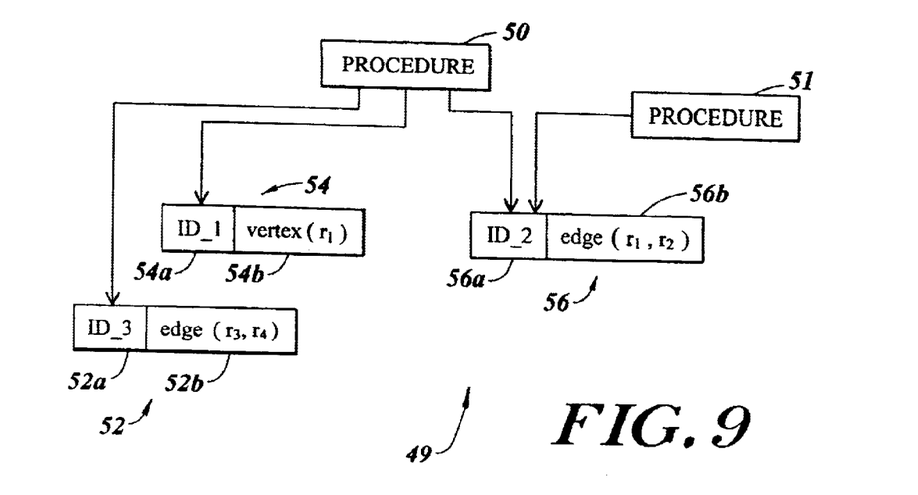
FIG. 9 shows a data structure, created by a CAD system incorporating the invention, in which procedures directly reference geometric elements.

FIG. 9 shows an abstract illustration of a data structure 49 having first and second procedures 50, 51 referencing three geometric elements 52, 54, 56 in a modeling environment. The first geometric element 54 includes a geometric primitive 54b that specifies that element's geometric properties. In this case, the geometric primitive 54b indicates that the first geometric element 54 is a vertex located at a position vector $\vec{r}_1$. The first geometric element also includes a statically bound identification tag 54a that permanently identifies the first geometric element 54. The second and third geometric elements 56, 52 likewise include statically bound identification tags 56a, 52a. The second geometric element 56 represents an edge having endpoints defined by position vectors $\vec{r}_1$ and $\vec{r}_2$ and the third geometric element 52 represents another edge having endpoints defined by position vectors $\vec{r}_3$ and $\vec{r}_4$.

Figure 10:
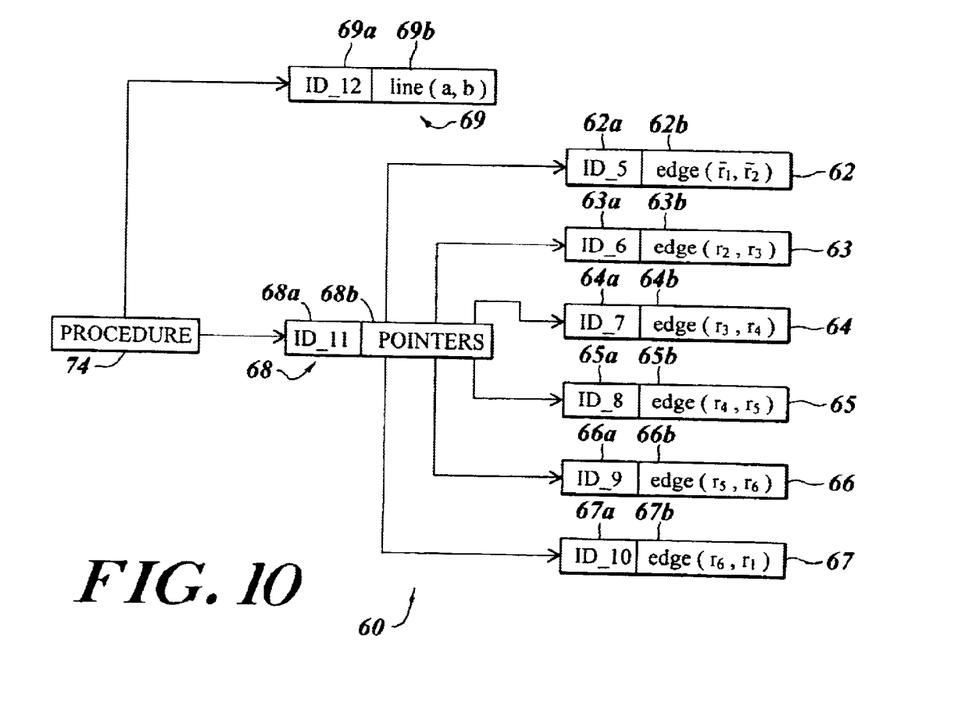
FIG. 10 shows a data structure representative of the structure in FIG. 1 in which selected geometric elements are associated together into a logical element.

Referring back to FIG. 8, the geometric elements created by the element editor 42 can also be passed to a logical binder 44a. The logical binder 44a associates these geometric elements together into a logical element. Each logical element, an example of which is shown in FIG. 10, includes pointers to one or more geometric elements and to a logical-element identification tag. The logical element generated by the logical binder 44a can then become an input parameter to one or more procedures 46b, 46c. Note that although FIG. 8 shows the logical binder 44a as an element separate from the procedure 46a, the instructions for performing the function of the logical binder 44a can readily be incorporated into the procedure 46a in a manner known to those of skill in the art.

FIG. 10 shows an abstract illustration of a data structure 60 in which six geometric elements 62–67 are bound together into a single logical element 68. Each geometric element 62–67 includes a corresponding geometric primitive 62b–67b indicating its geometric properties. The illustrated geometric primitives 62b–67b indicate that the six geometric elements 62–67 together define a hexagon having vertices at position vectors $\vec{r}_1 - \vec{r}_6$. Such a hexagon might represent the base of the prism 16 shown in FIG. 1. Each geometric element also includes a corresponding identification tag 62a–67a as discussed in connection with FIG. 9. FIG. 10 also includes a seventh geometric element 69 representative of the principal axis 18 shown in FIG. 1. Like the first six geometric elements 62–67, the seventh geometric element 69 includes an identification tag 69a statically bound to a geometric primitive 69b.

Because of their common function in defining the hexagonal base of the prism 16 in FIG. 1, it is useful to associate these six geometric elements 62–67 into a single logical element or logical group so that they can collectively be referred to by subsequent procedures. The result of this association, which is performed by the logical binder 44a shown in FIG. 8, is the logical element 68 shown in FIG. 10.

The illustrated logical element 68 includes a pointer field 68b having a plurality of dynamically bound pointers. These pointers reference the geometric elements 62–67 that are to be associated to form the logical element 68. In addition to referencing geometric elements, these pointers can also reference other logical elements. A logical element can therefore be an association of geometric elements, an association of other logical elements, or an association of both geometric elements and other logical elements. As noted above, the logical element 68 also includes a logical-element identification tag 68a statically bound to the pointer field 68b and permanently identifying the particular logical element 68.

Figure 11:
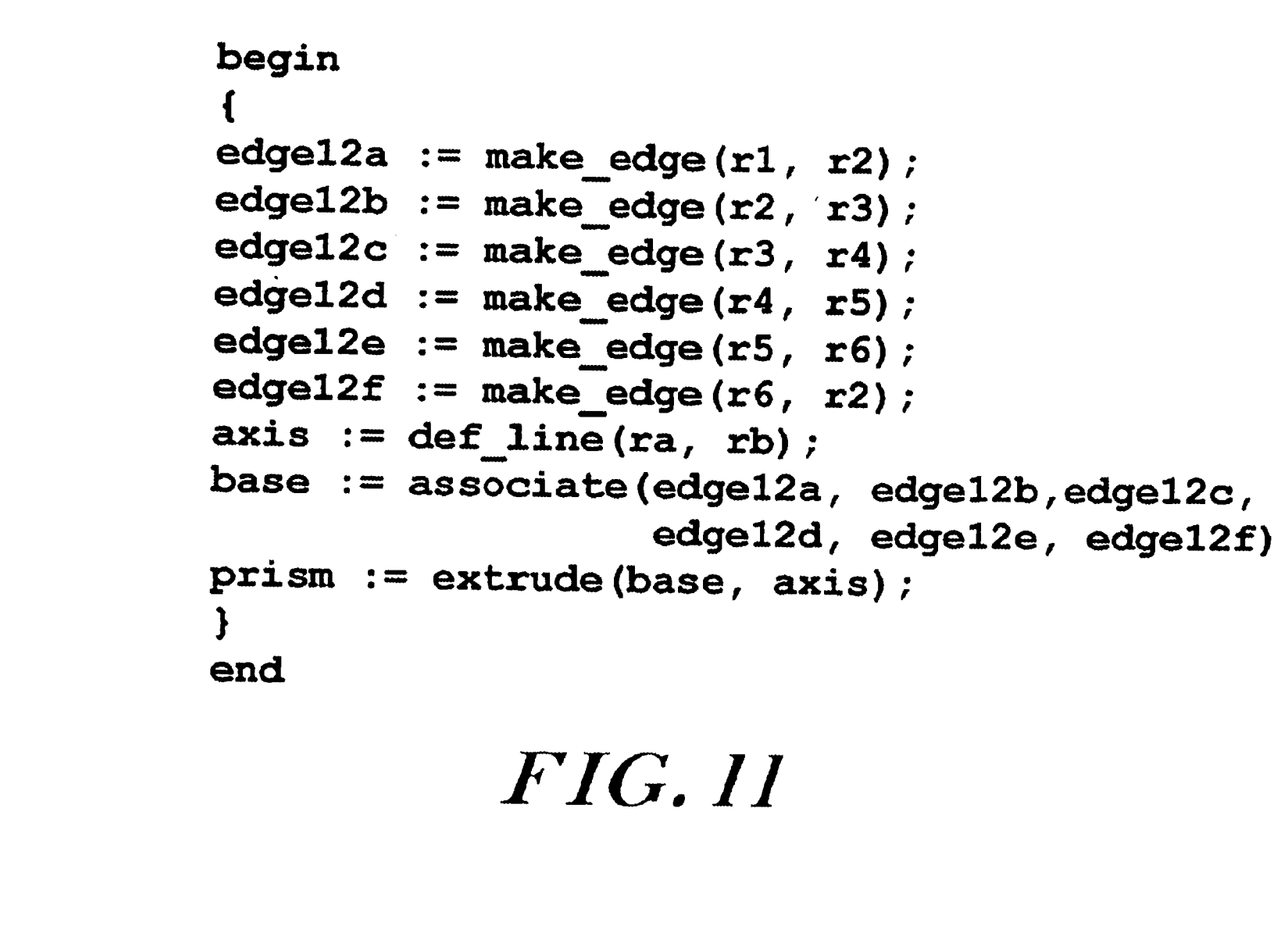
FIG. 11 shows an example of pseudo-code using a logical element to construct the geometric model of FIG. 1.

As shown in FIG. 10, a procedure 74 references the logical element 68. Because the procedure 74 does not directly reference the geometric elements 62–67, a change in the number of such elements does not affect the number of input parameters in the input parameter list of the procedure 74. This is apparent from the representative pseudo-code, shown in FIG. 11, which is used to construct the data structure of FIG. 10, and from inspection of the resulting data structure in FIG. 12.

Figure 12:
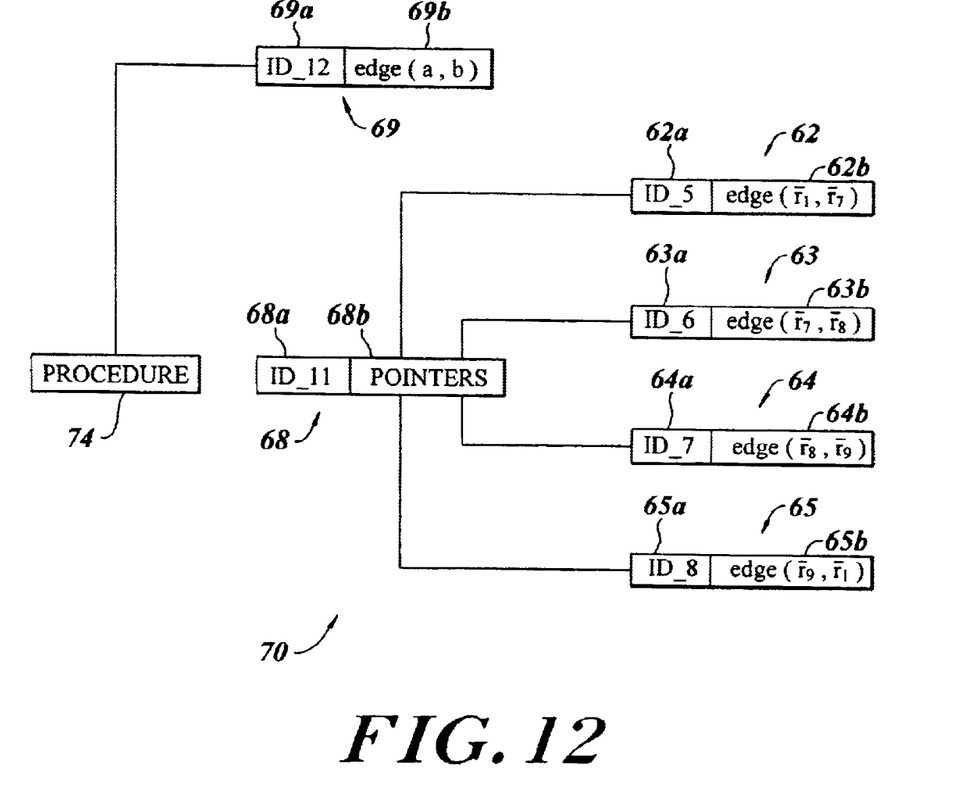
FIG. 12 shows a data structure representative of the structure in FIG. 4 in which geometric elements are associated together into a logical element.

In contrast to the data structure 60 shown in FIG. 10, the data structure 70 of FIG. 12 includes only four geometric elements 62–65. The geometric primitives 62b–65b associated with these geometric elements have been altered by the designer to reflect the new vertex locations for the square cross-section of the new prism 16" in FIG. 4. The four remaining geometric elements 62–65 continue to be associated into the logical element 68. Two of the pointers associated with the logical element 68 have been deleted to reflect the absence of the two geometric elements 66–67.

Because the pointers 68b are dynamically bound to the logical element 68, this change occurs automatically, without the need for the designer's intervention. An advantage of the data structure shown in FIG. 10 is therefore that the designer can freely alter the number of geometric elements associated with a particular constituent of a geometric model without the need to re-specify the input parameter list of each procedure referencing those elements.

In this detailed description, the operation of the invention is presented in terms of symbolic representations of operations on abstract quantities carried out by data processing systems. The use of such abstractions is common among those of skill in the data processing arts since it is widely acknowledged that such abstractions effectively and concisely convey the operation of data processing systems to others of skill in the data processing arts.

The process steps in the following description require physical manipulation of physical quantities representative of information. Because of the ease with which they can be stored, transmitted, and otherwise manipulated, these physical quantities are commonly electrical and magnetic signals. The agent of manipulation, storage or transmission typically includes a digital computer or similar device as shown in FIG. 3.

Having now described the invention and a preferred embodiment thereof, what we claim as new, and secured by Letters Patent is:

1. A computer implemented method for creating, from a plurality of constituent elements, a geometric model representative of a physical object, said method comprising the steps of:
   associating a plurality of selected constituent elements and a corresponding plurality of pointers to each of said selected constituent elements, thereby defining a logical element,
   establishing a dynamic link between said logical element and said selected constituent elements through each of said corresponding pointers;
   passing said logical element as an input parameter to a procedure, said procedure having, as an output, said geometric model representative of said physical object, said output being responsive to a change in said selected constituent elements.

2. The method of claim 1 further comprising the step of selecting at least one of said selected constituent elements to be a geometric element.

3. The method of claim 1 further comprising the step of selecting at least one of said selected constituent elements to be a second geometric model representative of a physical object.

4. The method of claim 1 further comprising the step of selecting at least one of said selected constituent elements to be a second logical element.

5. The method of claim 1 wherein said computer implemented method is implemented by a CAD system.

6. A computer readable medium having encoded thereon software for creating, from a plurality of constituent elements, a geometric model representative of a physical object, said software including instructions for executing the steps of:
   associating a plurality of selected constituent elements and a corresponding plurality of pointers to each of said selected constituent elements, thereby defining a logical element,
   establishing a dynamic link between said logical element and said selected constituent elements through each of said corresponding pointers;
   passing said logical element as an input parameter to a procedure, said procedure having, as an output, said geometric model representative of said physical object, said output being responsive to a change in said selected constituent elements.

7. The computer readable medium of claim 6 wherein said software further includes instructions for executing the step of selecting at least one of said selected constituent elements to be a geometric element.

8. The computer readable medium of claim 6 wherein said software further includes instructions for executing the step of selecting at least one of said selected constituent elements to be a second geometric model representative of a physical object.

9. The computer readable medium of claim 6 wherein said software further includes instructions for executing the step of selecting at least one of said selected constituent elements to be a second logical element.

10. The computer readable medium of claim 7 wherein said software is adapted for execution by a CAD system.

11. A computer-readable data structure representative of a geometric model of a physical object, said data structure comprising:
   a plurality of constituent elements;
   a logical element including a plurality of selected constituent elements from said plurality of constituent elements;

a corresponding plurality of pointers linking each of said selected constituent elements to said logical element; and dynamic linking means associated with each of said corresponding plurality of pointers, whereby a change in said selected constituent elements of said logical element results in a change in said geometric model.

12. The computer readable data structure of claim 11 wherein said selected constituent elements include a geometric element.

13. The computer readable data structure of claim 11 wherein said selected constituent elements include a second logical element.

14. The computer readable data structure of claim 11 wherein said selected constituent elements include a second geometric model representative of a physical object.

15. The computer readable data structure of claim 11 adapted to be readable by a CAD system.

* * * * *